(12) United States Patent
Nairn

(10) Patent No.: US 6,265,911 B1
(45) Date of Patent: Jul. 24, 2001

(54) SAMPLE AND HOLD CIRCUIT HAVING IMPROVED LINEARITY

(75) Inventor: David G. Nairn, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/452,445

(22) Filed: Dec. 2, 1999

(51) Int. Cl.[7] .................................................. G11C 27/02
(52) U.S. Cl. .............................................. 327/94; 327/91
(58) Field of Search ............................... 327/94, 91, 534; 341/122, 124

(56) References Cited

U.S. PATENT DOCUMENTS

| | | | |
|---|---|---|---|
| 4,308,468 | * 12/1981 | Olson | 327/94 |
| 4,862,016 | * 8/1989 | Genrich | 327/91 |
| 5,084,634 | * 1/1992 | Gorecki | 327/91 |
| 5,422,583 | * 6/1995 | Blake et al. | 327/94 |
| 5,489,870 | * 2/1996 | Arakawa | 327/536 |
| 5,506,525 | * 4/1996 | Debroux | 327/91 |
| 5,546,042 | * 8/1996 | Tedrow et al. | 327/538 |

* cited by examiner

Primary Examiner—Timothy P. Callahan
Assistant Examiner—Hai L. Nguyen
(74) Attorney, Agent, or Firm—Samuels, Gauthier & Stevens, LLP

(57) ABSTRACT

A sample and hold circuit having a semiconductor with a field effect transistor therein. The field effect transistor has a channel in the semiconductor, a source region in the semiconductor, a drain region in the semiconductor a front-gate disposed over the channel, and a back-gate in the semiconductor under the channel. The front-gate and back-gate are configured to control a flow of carriers in the semiconductor through a length of the channel between the source region and the drain region. A capacitor is connected to one of the drain and source regions. The other one of the source and drain region is configured for coupling to an input signal. A switch is responsive to a sampling signal to electrically connect a constant electrical potential between one of the source and drain regions and back-gate during a tracking phase. In one embodiment, the sample and hold circuit includes a second switch to electrically a second constant potential between the front-gate and one of the source and drain. With such an arrangement, non-linearities arising from variations in both the voltage between the source/drain and back-gate ($V_{(s/d)b}$) and between the source/drain and front-gate ($V_{(s/d)g}$) are compensated leading to a more linear sample and hold circuit. In a second embodiment, the second switch electrically connects a fixed potential to the front-gate during the tracking phase. With such an arrangement, non-linearities arising from variations in the voltage between the source/drain and back-gate ($V_{(s/d)b}$) are compensated leading to a more linear sample and hold circuit. Further, because the non-linearities due to $V_{sb}$ are dealt with, the need for a large ($V_{(s/d)g}$) (with the potential for voltages exceeding the supply voltage) is reduced. Hence circuit according to the invention yields reduced harmonic distortion without the need for large on-chip voltages.

2 Claims, 4 Drawing Sheets

SAMPLE AND HOLD CIRCUIT HAVING IMPROVED LINEARITY

BACKGROUND OF THE INVENTION

This invention relates generally to sample and hold circuits and particularly to sample and hold circuits having improved linearity.

As is known in the art, a sample and hold circuit includes a storage device, typically a capacitor, $C_h$, coupled to an input signal $V_{in}$ to be sampled through a switch, $S_1$ shown in FIG. 1. During the sampling, or tracking phase, switch $S_1$ is "on" or "closed" and such "closed" switch $S_1$ electrically connects the hold-capacitor $C_h$ to the input signal $V_{in}$. During the "hold" phase, the switch is "open" and hold-capacitor $C_h$ is electrically isolated from the voltage $V_{in}$ thereby storing, or holding, the last voltage of $V_{in}$ during the track phase. When implemented in Complementary Metal Oxide Semiconductor CMOS technology, as shown in FIG. 2, the switch $S_1$ is implemented with MOS FET $M_1$, here an NMOS FET and the control signal to open and close the switch $S_1$ is fed to the gate as a voltage $V_g$.

As is also known in the art, when the switch is implemented with a field effect transistor (FET), such transistor $M_1$, here a PMOS FET, as shown in FIG. 3, has a channel in a semiconductor, a source region, S, in the semiconductor, a drain region, D, in the semiconductor a front-gate, FG, disposed over the channel, and a back-gate, BG, in the semiconductor under the channel. The front-gate FG and the back-gate BG are configured to control a flow of carriers in the semiconductor through a length of the channel between the source region, S, and the drain region, D. The capacitor $C_h$ is connected to one of the drain and source regions, here to the drain region, D. The other one of the source and drain region, here the source region, S, is configured for coupling to an input signal, $V_g$. A switch, SW, is responsive to a sampling, or control signal, CS to electrically connect the front-gate FG to a constant potential $V_g$ during a tracking phase. (It should be understood that, as known in the art, the source and drain regions may be reversed in terminology and therefore, as is sometimes used herein, the term first region is used for one of the source and drain regions and the term second region is used for the other one of the source and drain regions. Thus, the front-gate and the back-gate are configured to control a flow of carriers through the channel between the first region and the second region).

During the tracking phase, the front-gate FG is coupled to $V_g$, which is more negative than the voltage on the source S. Thus, the MOS FET M1 is biased "on" and $C_h$ is electrically connected to $V_{in}$ via a low impedance path through $M_1$. During the hold phase, the front-gate FG voltage of $M_1$ is biased 5 volts positive than the voltage on the source S. Thus the transistor M1 is "off", and $C_h$ is electrically isolated from $V_{in}$.

As is also known, the "on" resistance of the field effect transistor (FET), that is, the resistance between the source region S and the drain region D when the transistor is "on', or conducting, is a function of the front-gate-to-source voltage, $V_{gs}$ and the source-to-back-gate voltage $V_{sb}$. Thus, the voltage sampled (i.e., stored) by the capacitor $C_h$ is a function of the "on" resistance. Consequently, the non-linearity in the 'on" resistance produces a non-linearity in the circuit, i.e., the voltage stored is a non-linear function of the input signal $V_{in}$. There have been several techniques suggested to reduce this non-linearity.

One technique uses CMOS FET devices (i.e., NMOS FET and PMOS FET) to cancel the non-linearities. Using this approach, the switch is implemented with a PMOS device in parallel with the NMOS device. The gate of the PMOS is driven by the logical complement of the signal used to drive the gate of the NMOS. By careful sizing of the PMOS device relative to that of the NMOS device, a reasonable degree of linearity can be achieved provided the logic levels (and the circuit's power supplies) are high enough in voltage. This technique however does not work well for low supply voltages (i.e., under 5 volts).

A second technique uses a boosted gate drive for driving a single FET. By increasing the front-gate voltage beyond the supply voltage during the "on" or tracking phase, the relative variation in $V_{gs}$ is reduced. This reduces the relative size of the switch's non-linearities. Such a circuit typically needs additional circuitry to generate on-chip voltages that are greater than the supply voltages. For low-voltage processes, these high voltages may reduce the product's reliability.

A third technique uses a bootstrapped gate drive for the switching device. By driving the front-gate of the switching transistor with a level shifted version of the signal that is applied to the switch's source, $V_{gs}$ is held constant. Since variations in $V_{gs}$ are the dominant source of non-linearity in the switching transistor, this approach greatly reduces the non-linearities of the switch. More particularly, reference is again to FIG. 3. Here, the switching transistor $M_1$ has the substrate, more particularly the back-gate, BG, connected to VDD, the drain region, D, connected to the hold-capacitor $C_h$ and the front-gate FG connected to a switch SW. During the sample, or track phase, the switch SW connects the front-gate FG to a voltage $V_{gs}$ provided between the source S and front-gate FG, as indicated. During the hold phase, the switch connects the front-gate FG to VDD. While this circuit is typically implemented with an NMOS device as the switch $S_1$, it is illustrated in FIG. 3 with a PMOS. Typically, the required $V_{gs}$ in this circuit is relatively large in order to achieve the desired linearity (i.e., to suppress the non-linearities due to variations in the source-to-back-gate voltage, $V_{sb}$.

These techniques described above are suitable for reducing the transistor switch's non-linearities provided that the supply voltages are not too low, that the signal frequencies of interest are not too high, and that the substrate doping in the process is not too high. With the move to shorter channel process, the substrate doping is increased. The higher substrate doping causes the second term, $V_{sb}$ to have a larger impact on the transistor switch's non-linearity. When combined with the reduced power supplies, the switch non-linearities become unacceptable for many high frequency applications.

SUMMARY OF THE INVENTION

In accordance with the present invention, a sample and hold circuit is provided having a semiconductor with a field effect transistor therein. The field effect transistor has a channel in the semiconductor, a first region in the semiconductor, a second region in the semiconductor, a front-gate over the channel, and a back-gate in the semiconductor under the channel. The front-gate and the back-gate are configured to control a flow of carriers in the semiconductor through a length of the channel between the first region and the second region. A capacitor is connected to one of the first and second regions. The other one of the first and second regions is configured for coupling to an input signal. A switch is responsive to a sampling signal to electrically connect a constant potential between one of the first and second regions and the back-gate during a tracking phase. That is, during the tracking phase, one of the first and second regions and the back-gate have a potential therebetween which is fixed and thus invariant with variations in the input signal.

With such an arrangement, non-linearities arising from variations in the input signal are removed from effecting the first/second region-to-back-gate voltage, $V_{(f/s)b}$, leading to a more linear sample and hold circuit. Further, because the non-linearities due to $V_{(f/s)/b}$ are dealt with, the need for a large front-gate-to-source voltage, $V_{gs}$, (with the potential for voltages exceeding the supply voltage) is reduced. Hence circuit according to the invention yields reduced harmonic distortion without the need for large on-chip voltages.

In one embodiment, the sample and hold circuit includes a second switch to electrically connect a second constant potential between the front-gate and one of the first and second regions during the tracking phase.

In another embodiment, the second switch electrically connects the front-gate to a fixed potential during the tracking phase.

With such an arrangement, non-linearities arising from variations in both the first/second region-to-back-gate voltage, $V_{(f/s)b}$, and the front-gate-to-first/second region voltage $V_{g(f/s)}$ are compensated leading to a more linear sample and hold circuit.

BRIEF DESCRIPTION OF THE DRAWINGS

These and other features of the invention will become more readily apparent from the following detailed description when read together with the accompanying drawings, in which.

DESCRIPTION OF THE PREFERRED EMBODIMENTS

Figure 1:
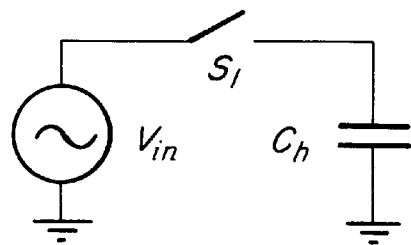
FIG. 1 is a schematic diagram of a sample and hold circuit according to the PRIOR ART.
Figure 2:
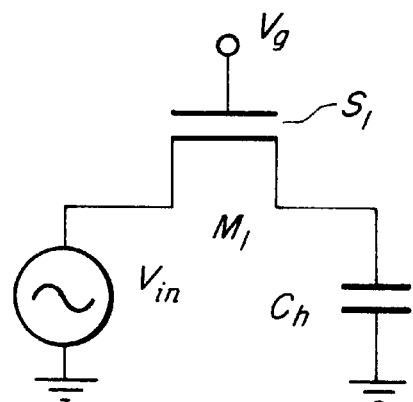
FIG. 2 is a schematic diagram of a field effect transistor-implemented sample and hold circuit according to the PRIOR ART.
Figure 3:
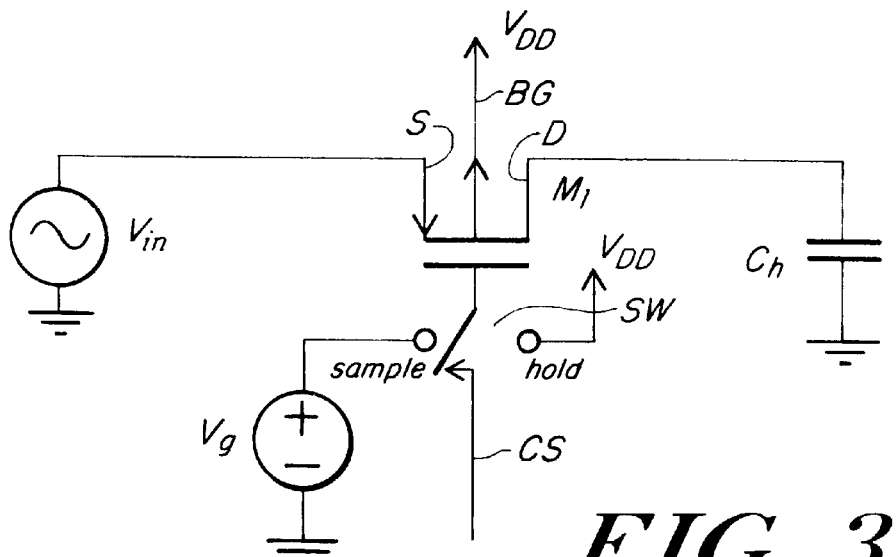
FIG. 3 is a schematic diagram of a field effect transistor-implemented sample and hold circuit according to the PRIOR ART.
Figure 4:
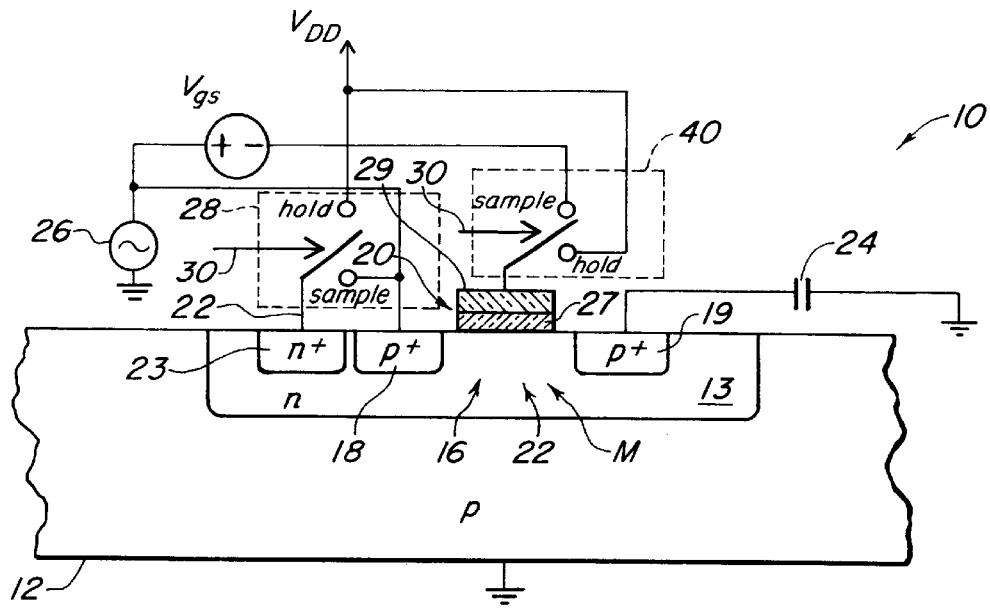
FIG. 4 is a diagrammatical cross-sectional sketch of a semiconductor having a field effect transistor therein shown schematically connected to other circuit elements to provide a sample and hold circuit according to the invention.
Figure 5:
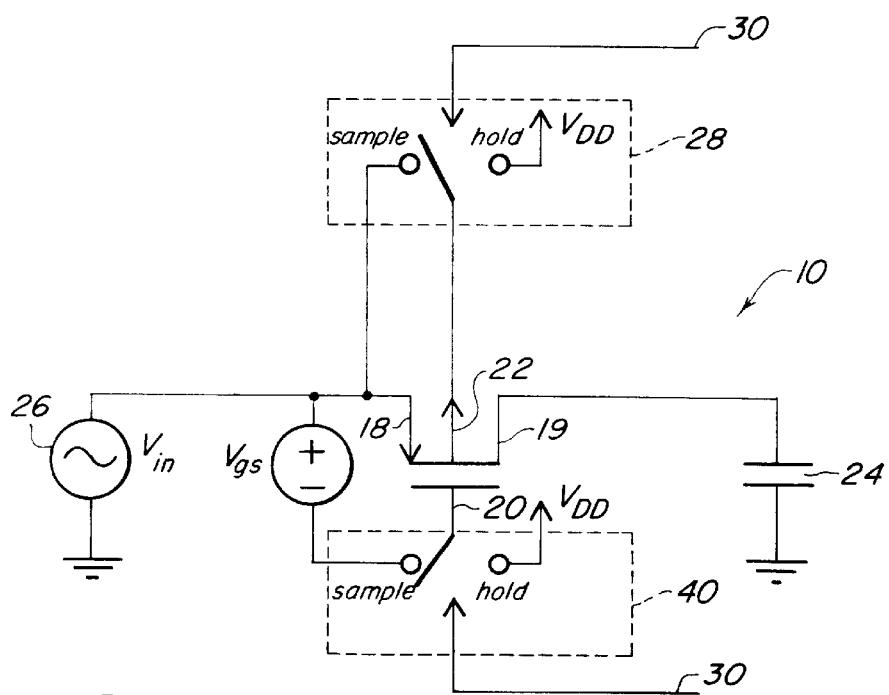
FIG. 5 is a schematic diagram of the sample and hold circuit of FIG. 4.

Referring now to FIGS. 4 and 5, a sample and hold circuit 10 is shown. The circuit 10 includes a semiconductor, here a p type conductivity silicon semiconductor substrate 12, having a field effect transistor device 14 formed therein, here a PMOS FET device. Thus, the p type conductivity substrate 12 has an n type conductivity well 13 formed in the upper portion thereof. The n type conductivity well has a p+ type conductivity first region, here a source region 18, and a p type conductivity second region, here a drain region 19 formed therein, as indicated. An n+ type conductivity region 23 is also formed in the n type conductivity well 13 to provide an ohmic contact to the back-gate 22. More particularly, the PMOS FET 14 includes: a channel 16 in the semiconductor 12; a source region 18 in the semiconductor 12; a drain region 19 in the semiconductor 12; a front-gate 20 over the channel 16 and the back-gate 22 in the semiconductor 12 under the channel 16. It is noted that the front-gate 20 includes a dielectric layer 27 on the upper surface of the substrate 12 and a conductor 29 on the upper surface of the dielectric layer 27. The back-gate 22 is electrically connected to the n+type ohmic contact region 23 through the n type conductivity well 13. The front-gate 20 and back-gate 22 are configured to control a flow of carriers in the semiconductor 12 through a length, L, of the channel 16 between the source region 18 and the drain region 19.

Figure 8:
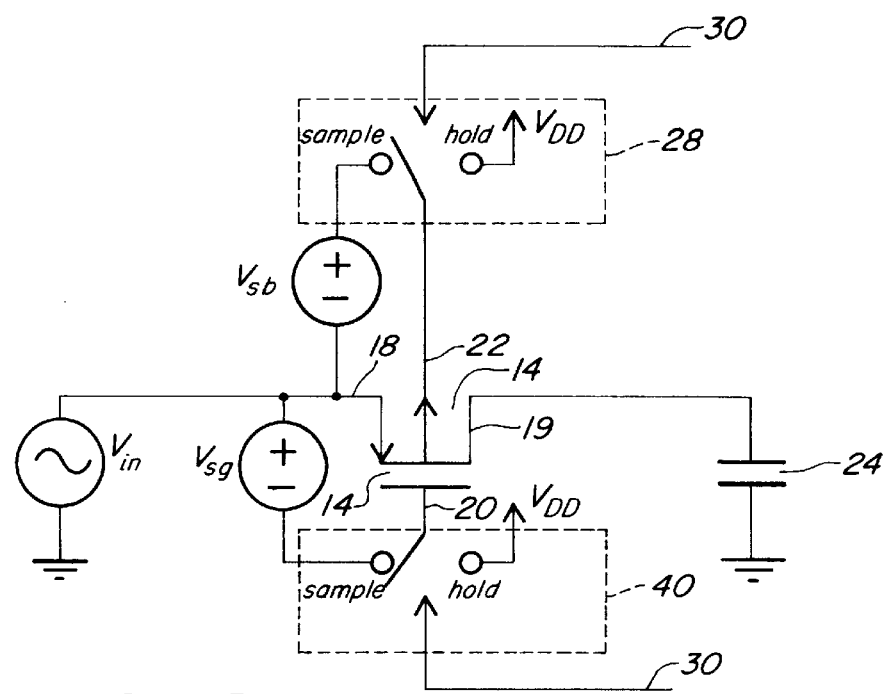
FIG. 8 is another alternative embodiment of a sample and hold circuit according to the invention; an FIG. 9 is still another alternative embodiment of a sample and hold circuit according to the invention.

A capacitor 24 is connected to one of the drain and source regions, here the drain region 19. The other one of the source and drain region, here the source region 18 is configured for coupling to an input signal source 26. The circuit 10 includes a switch 28 responsive to a sampling signal on control line 30 to: (A) electrically connect a constant electrical potential between the source region 18 and back-gate 22 during a tracking phase while drain region 19 is electrically coupled to the capacitor 24 through the channel 16 of the device 14; and, (B) electrically isolate the capacitor 24 from source region 18 during a subsequent hold phase. More particularly, during the sampling phase, the back-gate ohmic contact region 23 is electrically shorted to the source region 18 so that the back-gate 22 and the source region 18 have a fixed potential between them independent of variations in the voltage of the input signal $V_{in}$. It should be understood, therefore, that the fixed potential between the source region 18 and at the back-gate 22 does not vary with respect to each other during the tracking phase. That is, here the difference between the electrical potential at the source region 18, $V_s$, and the electrical potential at the back-gate $V_{bg}$ is zero, independent of variations in the voltage of the input signal $V_{in}$, i.e., here $V_s - V_{bg} = V_{sb} = 0$. It should be understood that to achieve the same effect in reducing non-linearity, $V_s - V_{bg} = V_{sb}$ need not be zero but rather equal to a constant, K, where K is invariant with variations in the voltage of the input signal $V_{in}$. For example, referring to FIG. 8, the $V_s - V_{bg} = V_{sb}$ is shown as a fixed, non-zero voltage, $V_{sb}$.

The circuit 10 also includes a second switch 40 to electrically connect the front-gate 20 and the source region 18 to a second constant potential, here $V_{gs}$, (here +5 volts) therebetween during the tracking phase and to de-couple the front-gate 20 and the source region 18 from the second constant potential during the hold phase. In the circuit shown in FIG. 5, the second switch 40 connects the front-gate 20 to the fixed voltage $V_{gs}$ during the tracking phase. Further, during the hold phase, the switches 28 and 40 electrically connect the back-gate ohmic contact region 23 and the front-gate 20 to the supply voltage VDD, here +5 volts. Thus, during the tracking phase, the transistor 14 is biased to an "on" condition and the input signal $V_{in}$ is coupled from the source region 18, through the channel 22, to the drain 19 and then to capacitor 24. It is noted that because there is a constant potential between the back-gate 22 and the source region 18 (i.e., the potential between the back-gate 22 and the source region 18 is invariant with variations in the input signal, $V_{in}$, i.e., $V_{sb}$=K, as discussed above) any variations in the resistance through the channel 22 because of variations in the level of the voltage of the input signal $V_{in}$, are removed.

Further, during the tracking phase, the front-gate 20 is driven by a level-shifted version of the input signal $V_{in}$, (i.e., level shifted by the constant voltage $V_{gs}$). With these connection, $V_{gs}$ and $V_{sb}$ constant (i.e., at constant potential with variations in the input signal $V_{in}$, during the tracking phase), the aforementioned non-linearities are eliminated. When the control signal on line 30 changes logic state, the switches 28 and 40 couple the back-gate 22 and the front-gate 20 to VDD thereby placing the transistor 14 in the "off" state. Note that it is necessary to connect the back-gate 22 to VDD (or to a voltage that is guaranteed to be above $V_{in}$ at all times) to ensure the p-n junctions in the transistor 14 do not become forward biased and turn "on".

Figure 6:
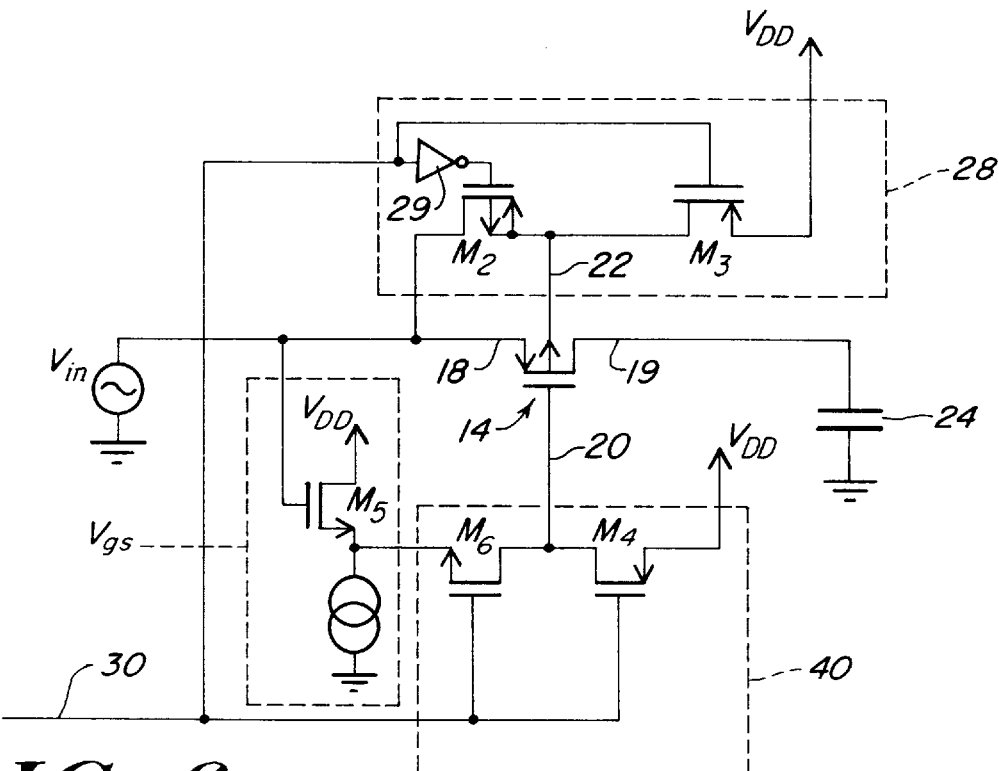
FIG. 6 is a more detailed schematic diagram of the sample and hold circuit of FIG. 4.

Referring now to FIG. 6, an implementation of the circuit 10 is shown in more detail. The switch 28 includes a PMOS device $M_2$, a PMOS device, and an inverter 29 arranged as shown. The inverter 29 is fed by the SAMPLE/HOLD control signal on line 30. The output of the inverter 29 is fed to the front-gate of transistor $M_2$, as shown. Switch 40 (FIG. 5) is implemented with a PMOS device M4 and an NMOS device $M_6$, arranged as shown. The bias voltage $V_{gs}$ (FIG. 5) is implemented with NMOS device $M_5$ and the current source, as indicated. During the tracking phase, the PMOS devices 14, $M_2$, and the NMOS device $M_6$ conduct while the PMOS devices $M_3$ and $M_4$ are "off". Thus, during the tracking (i.e., sample) phase, the source 18 is connected to the back-gate 22 (i.e., the back-gate 22 and the source 18 have a constant potential between them that does not vary with changes in the voltage of the signal Vin). Further, during the tracking phase, since transistor $M_1$ is biased to conduction, the input signal $V_{in}$, is coupled through the conducting transistor M1 to the capacitor $C_h$.

During the subsequent hold phase, transistor $M_6$ is turned "off" and transistors $M_3$ and $M_4$ are turned "on" thereby coupling the front-gate 20 of transistor $M_1$ through "on" transistor $M_4$ to VDD to thereby turn transistor $M_1$ "off" thus de-coupling the capacitor $C_h$ from the input signal $V_{in}$. This circuit controls both the switch's front-gate 19 and the back-gate 22 during the "on" or tracking phase of transistor $M_1$ such that the non-linearities described above are significantly reduced.

Figure 7:
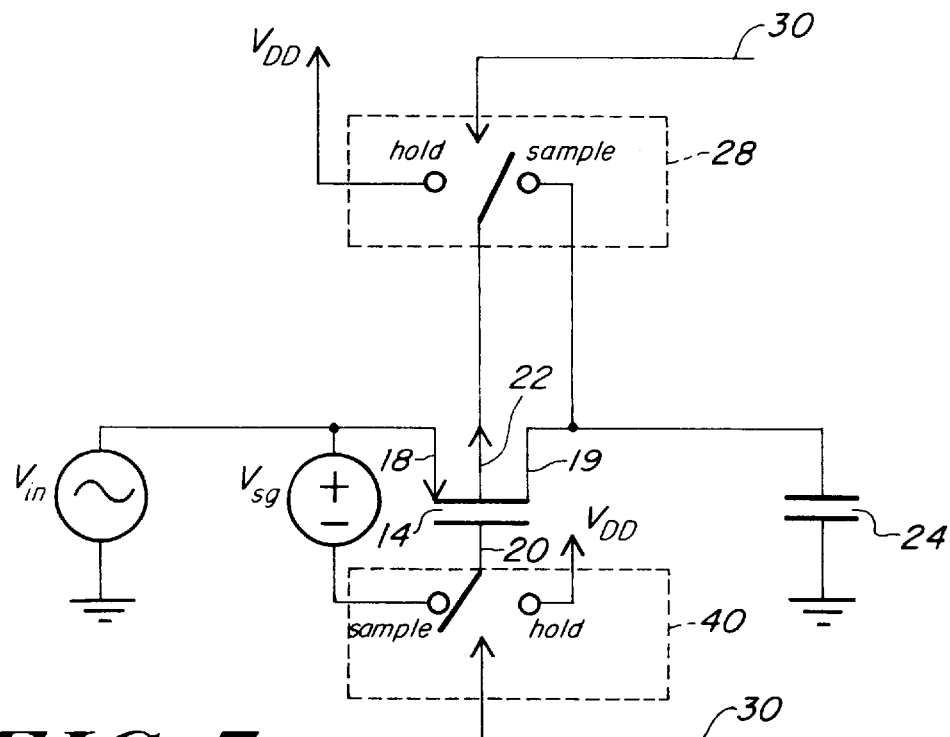
FIG. 7 is an alternative embodiment of a sample and hold circuit according to the invention.
Figure 9:
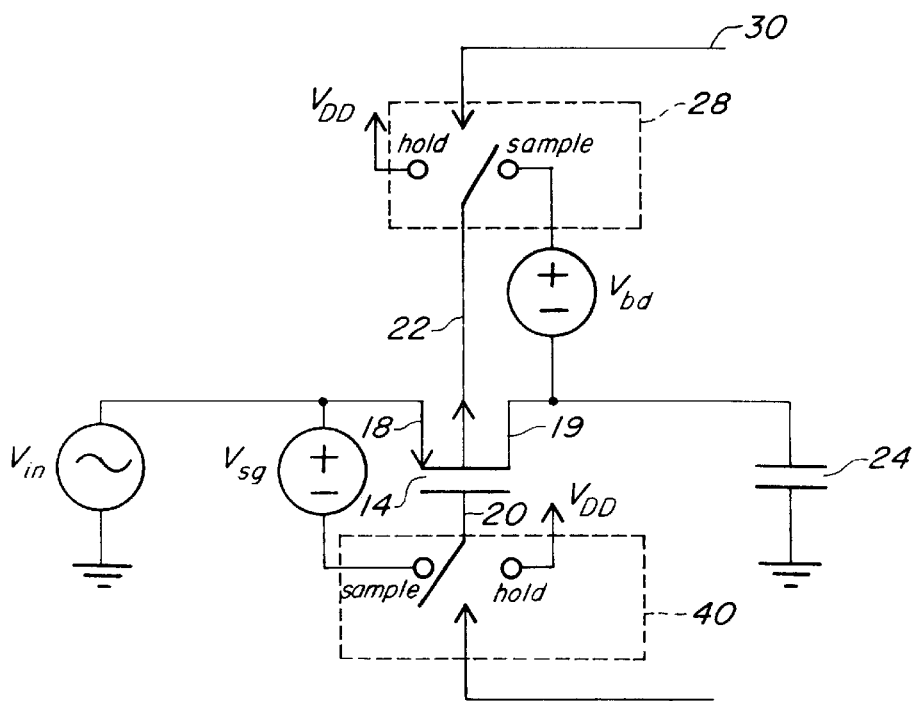

Other embodiments are within the spirit and scope of the appended claims. For example, referring to FIG. 7, the switch 28 provides a constant, here zero, potential between the back-gate 22 and the drain 19 during the tracking phase and connects the back-gate 22 to the supply voltage VDD during the subsequent holding phase. Referring to FIG. 9, the switch 28 the switch 28 provides a constant, here non-zero, potential, $V_{bd}$ between the back-gate 22 and the drain 19 during the tracking phase and connects the back-gate 22 to the supply voltage VDD during the subsequent holding phase.

What is claimed is:

1. A sample and hold circuit, comprising:
a semiconductor having a field effect transistor device, such device including,
a channel in the semiconductor,
a first region in the semiconductor,
a second region in the semiconductor,
a front-gate disposed over the, channel
a back-gate in the semiconductor under the channel;
said front-gate and said back-gate being configured to control a flow of carriers in
the semiconductor through the channel between said first region and said second region;
a capacitor connected to one of said first and second regions, the other one of said first and second regions being configured for coupling to an input signal;
a first switch, responsive to a sampling signal, to electrically connect an input signal invariant electrical potential between one of said first and second regions and said back-gate during a tracking phase and to, during a subsequent hold phase, electrically isolate said capacitor from the input signal and said back-gate from said first and second regions; and
a second switch to electrically connect an input signal invariant potential between said front-gate and one of said first and second regions during the tracking phase to remove variations in resistance through said channel.

2. A sample and hold circuit, comprising:
a semiconductor having a field effect transistor device, such device including,
a channel in the semiconductor,
a first region in the semiconductor,
a second region in the semiconductor,
a front-gate disposed over the channel, and
a back-gate in the semiconductor under the channel;
said front-gate and said back-gate being configured to control a flow of carriers in
the semiconductor through the channel between said first region and said second region;
a capacitor connected to one of said first and second regions, the other one of said first and second regions being configured for coupling to an input signal;
a first switch, responsive to a sampling signal, to electrically connect an input signal invariant electrical potential between one of said first and second regions and said back-gate during a tracking phase and to, during a subsequent hold phase, electrically isolate said capacitor from the input signal and said back-gate from said first and second regions; and
a second switch to electrically connect an input signal invariant potential to said front-gate during the tracking phase to remove variations in resistance through said channel.

* * * * *